United States Patent
Yamauchi (10) Patent No.: US 7,379,318 B2
(45) Date of Patent: May 27, 2008

(54) SEMICONDUCTOR INTEGRATED CIRCUIT DEVICE AND METHOD FOR MANUFACTURING THE SAME

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 192 days.

(21) Appl. No.: 11/085,579

(22) Filed: Mar. 22, 2005

(65) Prior Publication Data

US 2005/0221561 A1 Oct. 6, 2005

(30) Foreign Application Priority Data

Apr. 6, 2004 (JP) ............... 2004-112102

(51) Int. Cl.
*G11C 17/10* (2006.01)
*G11C 11/41* (2006.01)

(52) U.S. Cl. ..................... 365/104; 365/154
(58) Field of Classification Search ........... 365/154, 365/104, 188; 257/391, 392
See application file for complete search history.

(56) References Cited

U.S. PATENT DOCUMENTS

| | | | |
|---|---|---|---|
| 5,343,437 A * | 8/1994 | Johnson et al. | 365/230.03 |
| 5,668,752 A * | 9/1997 | Hashimoto | 365/104 |
| 6,041,008 A | 3/2000 | Marr | |
| 6,438,024 B1 | 8/2002 | Gold et al. | |
| 2001/0025997 A1* | 10/2001 | Onishi | 257/402 |
| 2003/0185085 A1* | 10/2003 | Kaneko | 365/230.03 |
| 2004/0004882 A1 | 1/2004 | Liaw et al. | |

FOREIGN PATENT DOCUMENTS

| | | |
|---|---|---|
| JP | 11-195976 | 7/1999 |
| JP | 2000-133701 A | 5/2000 |
| WO | WO 2004015711 A2 * | 2/2004 |

* cited by examiner

*Primary Examiner*—Tuan T. Nguyen
*Assistant Examiner*—Douglas King
(74) *Attorney, Agent, or Firm*—McDermott Will & Emery LLP

(57) ABSTRACT

A semiconductor integrated circuit device includes a semiconductor substrate and a ROM region, an SRAM region and a peripheral circuit region which are formed on the semiconductor substrate. Further, a column switch region is provided adjacent to the ROM region. MOS transistors in the ROM region and channel regions of access transistors in the SRAM region have substantially the same p-type impurity concentration. Accordingly, the threshold voltages of the transistors are adjusted by making use of the great dependence of the threshold voltage of the transistor on the channel width.

5 Claims, 9 Drawing Sheets

| | ROM REGION 2 | SRAM REGION 3 |
|---|---|---|
| TRANSISTOR CHANNEL WIDTH | 0.20 μm | 0.10 μm |
| RANSISTOR THRESHOLD VOLTAGE | 0.30 V | 0.25 V |
| THE NUMBER OF TRANSISTORS CONNECTED TO A SINGLE BIT LINE | 1024 | 256 |
| OFF-LEAK CURRENT PER TRANSISTOR | 2.5 nA | 10 nA |
| OFF-LEAK CURRENT PER BIT LINE (BIT LINE LEAK CURRENT) | 2.56 μA | 2.56 μA |

|  | ROM REGION 2 | SRAM REGION 3 |
|---|---|---|
| TRANSISTOR CHANNEL WIDTH | 0.20 μm | 0.10 μm |
| RANSISTOR THRESHOLD VOLTAGE | 0.30 V | 0.25 V |
| THE NUMBER OF TRANSISTORS CONNECTED TO A SINGLE BIT LINE | 1024 | 256 |
| OFF-LEAK CURRENT PER TRANSISTOR | 2.5 nA | 10 nA |
| OFF-LEAK CURRENT PER BIT LINE (BIT LINE LEAK CURRENT) | 2.56 μA | 2.56 μA |

SEMICONDUCTOR INTEGRATED CIRCUIT DEVICE AND METHOD FOR MANUFACTURING THE SAME

CROSS-REFERENCE TO RELATED APPLICATION

This non-provisional application claims priority under 35 U.S.C. §119(a) on Patent Application No. 2004-112102 filed in Japan on Apr. 6, 2004, the entire contents of which are hereby incorporated by reference.

BACKGROUND OF THE INVENTION (a) Field of the Invention

The present invention relates to a semiconductor integrated circuit device including SRAMs and ROMs and a method for manufacturing the same.

(b) Description of Related Art

In the field of LSI (large-scale integrated circuit), reduction of leak current which flows while the MOS transistors are in the off state (off-leak current) is one of important objects to achieve. For reduction of the off-leak current, in general, there has been employed a technique of increasing the threshold voltage of the MOS transistor.

Specific means of increasing the threshold voltage of the MOS transistor have been disclosed, for example, a method of increasing a channel impurity concentration and a method of controlling a substrate bias. For example, Japanese Unexamined Patent Publication No. 11-195976 discloses a method of selectively increasing the threshold voltage of a certain MOS transistor on a circuit.

However, MOS transistors in a practical LSI do not have the same threshold voltage and in most cases they have different threshold voltages. Accordingly, it is not easy to selectively increase the threshold voltage of a certain MOS transistor. For example, with a decrease in channel width of the MOS transistor, an electric field is generated locally at the edge of an active region below a gate electrode of the MOS transistor, thereby causing an inverse narrow channel effect of great influence. Therefore, the threshold voltage of the MOS transistor may possibly decrease with the decrease in channel width.

In particular, on an LSI including SRAMs, ROMs and logic circuits in combination, MOS transistors of different channel widths are provided for the SRAMs, ROMs and logic circuits, respectively. Accordingly, the influence of the inverse narrow channel effect also varies among the MOS transistors and the MOS transistors will have different threshold voltages.

For example, Japanese Unexamined Patent Publication No. 2000-133701 proposes improvements of a process for suppressing the inverse narrow channel effect.

SUMMARY OF THE INVENTION

On an LSI including SRAMs, ROMs and logic circuits in combination, MOS transistors provided for the SRAMs and the ROMs are smaller in size than those for the logic circuits. Therefore, an inversed narrow channel effect occurs to reduce the threshold voltage, thereby increasing off-leak current and bit line leak current. This increases the possibility of malfunction of the SRAMs and the ROMs.

Further, since the inverse narrow channel effect varies depending on the channel width, the MOS transistors of the SRAMs and those of the ROMs are different in off-leak current value. However, if the threshold voltages of the whole MOS transistors are set high with a certain margin to suppress the off-leak current, the SRAMs and the ROMs decrease in access speed and the logic circuits decrease in operating frequency.

In particular, the ROMs have been demanded to be highly integrated. Therefore, in general, 1024 or more memory cells are connected to a single bit line. On the other hand, in the SRAMs, about one-fourth or less of the memory cells are connected to a single bit line. Accordingly, the ROMs and the SRAMs are different in acceptable value of the off-leak current per memory cell. Thus, the SRAMs and the ROMs are different in requirements as to the threshold voltages of their MOS transistors.

However, if the threshold voltage adjustment is carried out to the MOS transistors of the logic circuits, SRAMs and ROMs by the above-described conventional method, a manufacturing process becomes complicated, thereby increasing cost. In addition, the conventional method has limitations in optimizing the threshold voltages of the MOS transistors in the logic circuits, SRAMs and ROMs.

Under the above-described circumstances, the present invention has been achieved. An object of the present invention is to provide a semiconductor integrated circuit device including SRAMs and ROMs which are provided with associated transistors that meet their requirements as to threshold voltages.

A semiconductor integrated circuit device of the present invention comprises a semiconductor substrate including an SRAM region and a ROM region; a plurality of SRAM memory cells, each of which is formed in the SRAM region and includes a flip-flop, a pair of first conductivity type access transistors connected to the flip-flop and a pair of SRAM bit lines connected to the paired access transistors, respectively; and a plurality of ROM memory cells, each of which is formed in the ROM region and includes a first conductivity type ROM transistor and a ROM bit line connected to the ROM transistor, wherein the SRAM memory cells connected to the paired SRAM bit lines are smaller in number than the ROM memory cells connected to the ROM bit line and the ROM transistor has a larger channel width than the access transistors.

According to the present invention, even if the requirements as to threshold voltages of the transistors are different between the SRAM region and the ROM region, adjustments are made to the number of transistors connected to a single bit line and the channel widths of the transistors in the SRAM region and the ROM region without performing impurity implantation more times. Thus, a semiconductor integrated circuit device having SRAMs and ROMs provided with transistors capable of operating at required threshold voltages is obtained.

According to the present invention, the SRAM memory cells connected to each pair of SRAM bit lines vary in number from the ROM memory cells connected to the ROM bit line depending on the difference in off-leak current between said one of the paired access transistors and the ROM transistor.

This allows defining bit line leak currents as required by the ROM region and the SRAM region, respectively.

It is preferable that the semiconductor substrate further includes a ROM column switch region having a ROM column switch made of a first conductivity type switching transistor connected to the ROM bit line and the switching transistor is implanted with second conductivity type impurities at a concentration different from the concentration of the ROM transistor so that the absolute value of the threshold voltage thereof is reduced.

A bit line precharge potential is a voltage obtained by subtracting the threshold voltage of the switching transistor from a power voltage. Therefore, if the absolute value of the threshold voltage of the switching transistor is reduced, a voltage between source/drain of the ROM transistor increases and a larger on-current is obtained. Thus, the ROM is operated with stability at a low voltage.

The ROM bit line includes a main line and a sub line connected to the main line and the switching transistor may be connected to the main line.

It is preferable that the semiconductor integrated circuit device of the present invention further comprises a first conductivity type connection transistor connected to the switching transistor and a sense amplifier connected to the connection transistor. Further, the connection transistor is implanted with second conductivity type impurities at the same concentration as the switching transistor.

With this configuration, the capacitance of the bit line between the ROM column switch and the sense amplifier becomes ignorable.

A method for manufacturing the semiconductor integrated circuit device of the present invention comprises the steps of: (a) preparing a semiconductor substrate including a ROM region, a ROM column switch region, an SRAM region and a peripheral circuit region, forming a first resist on the ROM column switch region and implanting first conductivity type impurities using the first resist as a mask to form an impurity region at the top of the ROM region, SRAM region and peripheral circuit region; (b) forming a second resist on the ROM column switch region and the peripheral circuit region and implanting first conductivity type impurities using the second resist as a mask to form a high concentration impurity region at the top of the ROM region and the SRAM region; and (c) forming second conductivity type transistors in the ROM region, ROM column switch region, SRAM region and peripheral circuit region, respectively, wherein in the step (c), the channel widths of the transistors are adjusted to determine the threshold voltages of the transistors, respectively.

According to the present invention, even if requirements as to threshold voltages of the transistors are different between the SRAM region and the ROM region, adjustments are made to the number of transistors connected to a single bit line and the channel widths of the transistors in the SRAM region and the ROM region without performing impurity implantation more times. Thus, a semiconductor integrated circuit device having SRAMs and ROMs provided with transistors capable of operating at required threshold voltages is obtained.

The step (c) is preferably followed by the step (d) of determining the number of transistors to be connected to a single bit line in accordance with the requirements of the ROM region and the SRAM region and connecting bit lines and the transistors in the ROM region and the SRAM region.

As described above, the present invention allows providing a semiconductor integrated circuit device having SRAMs and ROMs provided with associated transistors that meet their requirements as to threshold voltages is provided.

DETAILED DESCRIPTION OF THE INVENTION

Hereinafter, a detailed explanation is given of an embodiment of the present invention with reference to the drawings.

Embodiment 1

Semiconductor Integrated Circuit Device

Figure 1:
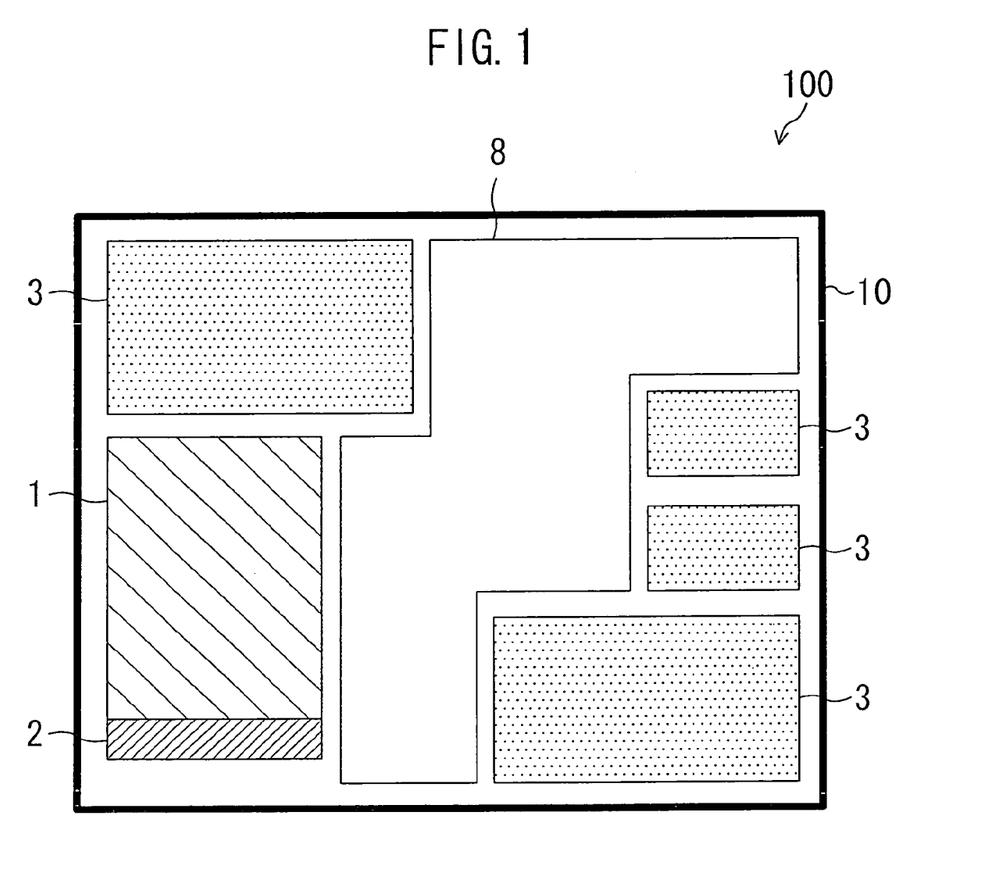
FIG. 1 is a top view illustrating a semiconductor integrated circuit device according to an embodiment of the present invention.

FIG. 1 is a top view illustrating a configuration of a semiconductor integrated circuit device of the present embodiment.

The semiconductor integrated circuit device 100 of the present embodiment includes, as shown in FIG. 1, a semiconductor substrate 10 and a ROM region 1, SRAM regions 3 and a logic circuit region 8 formed on the semiconductor substrate 10. In the present embodiment, a column switch region 2 is provided adjacent to the ROM region 1.

Figure 2:
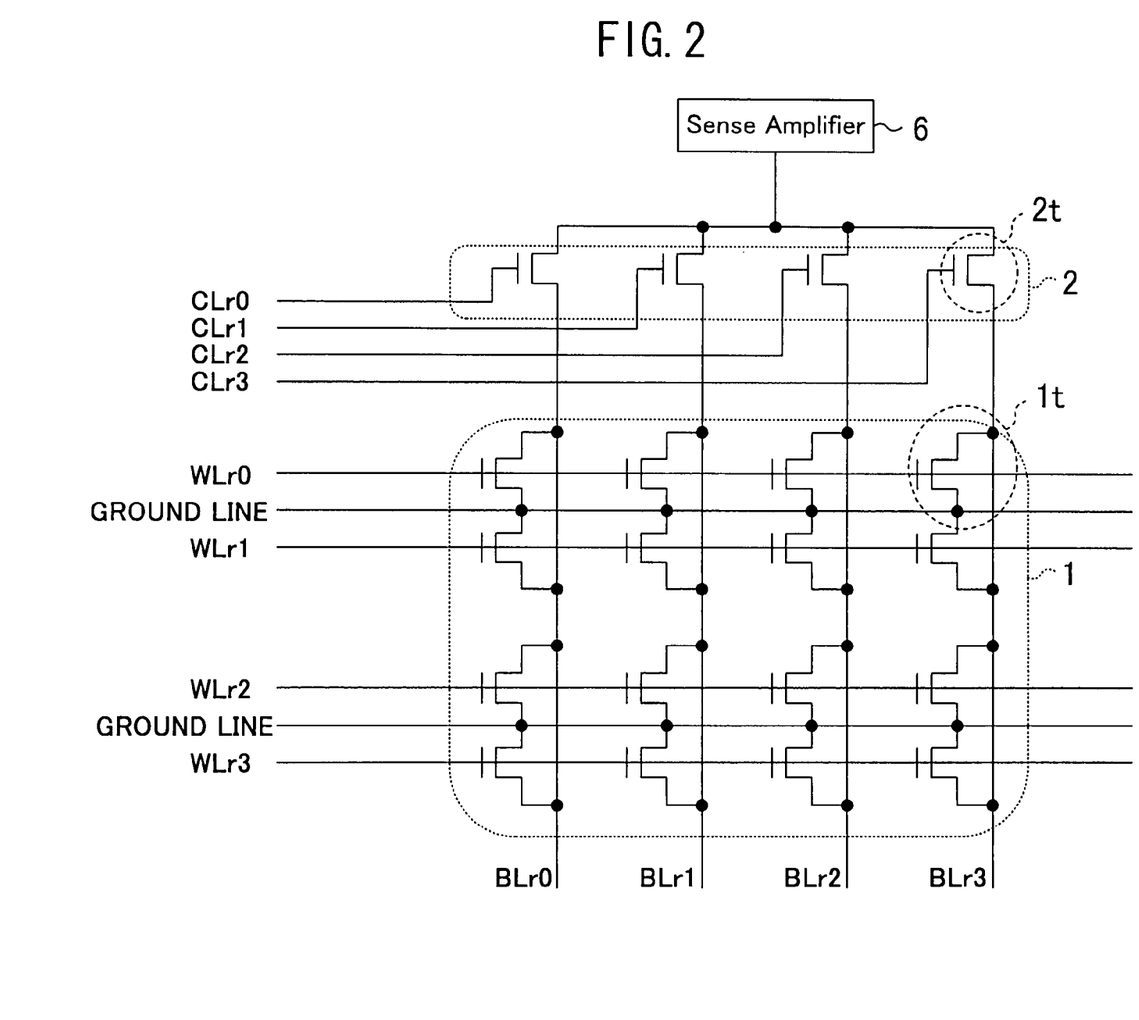
FIG. 2 is a view illustrating a circuit configuration of the semiconductor integrated circuit device according to the embodiment of the present invention.

Referring to FIG. 2, the ROM region 1 and the column switch region 2 are described. FIG. 2 is a view illustrating a circuit configuration in the ROM region 1 and the column switch region 2 of the present embodiment.

In the ROM region 1, as shown in FIG. 2, n-channel type MOS transistors 1t are arranged in matrix. Sources/drains of the MOS transistors 1t are connected to bit lines BLr (BLr0 to BLr3 in FIG. 2) and ground lines, while gates are connected to word lines WLr (WLr0 to WLr3 in FIG. 2). That is, in the present embodiment, a ROM memory cell is constituted of a single MOS transistor 1t and a ground line, a bit line BLr and a word line WLr which are connected to the MOS transistor 1t as shown in FIG. 2.

In the column switch region 2, as shown in FIG. 2, n-channel type MOS transistors 2t are arranged in a one-to-one relationship with the bit lines. Sources/drains of the MOS transistors 2t are connected to bit lines BLr (BLr0 to BLr3 in FIG. 2) and a sense amplifier 6, while gates are connected to column select lines CLr (CLr0 to CLr3 in FIG. 2), respectively.

Figure 3:
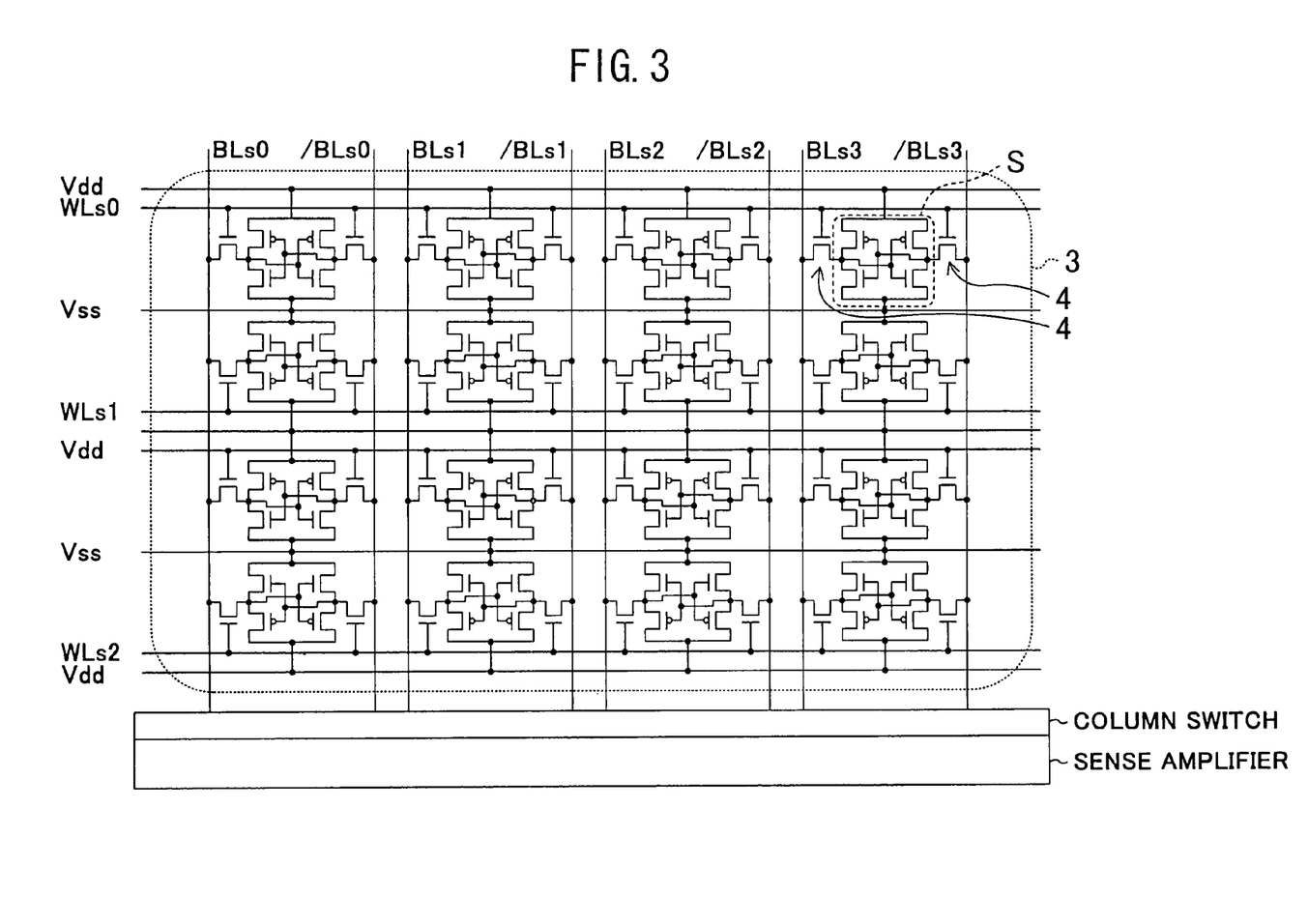
FIG. 3 is a view illustrating a circuit configuration of the semiconductor integrated circuit device according to the embodiment of the present invention.

Then, the SRAM region 3 is described with reference to FIG. 3. FIG. 3 is a view illustrating a circuit configuration in the SRAM region 3 of the present embodiment.

In the SRAM region 3, as shown in FIG. 3, SRAM memory cells are arranged in matrix. Each of the SRAM memory cell includes a complementary data storage S (flip-flop) made of cross-coupled CMOS inverters, a power line Vdd and a ground line Vss connected to the data storage S, a pair of bit lines BLs and /BLs (BLs0 to BLs3 and /BLs0 to /BLs3 in FIG. 3), a word line WLs (WLs0 to WLs2 in FIG. 3) and a pair of n-channel type access transistors 4 connecting the data storage S and the paired bit lines.

The paired bit lines BLs and /BLs are connected to a column switch and the column switch is connected to a sense amplifier as shown in FIG. 3.

In the semiconductor integrated circuit device 100 of the present embodiment, the MOS transistors 1$t$ in the ROM region 1 and the channel regions of the access transistors 4 in the SRAM region 3 have substantially the same p-type impurity concentration. Therefore, in this embodiment, an adjustment is made to the threshold voltages of the transistors by making use of the great dependence of the threshold voltage of the transistor on the channel width.

Figure 4:
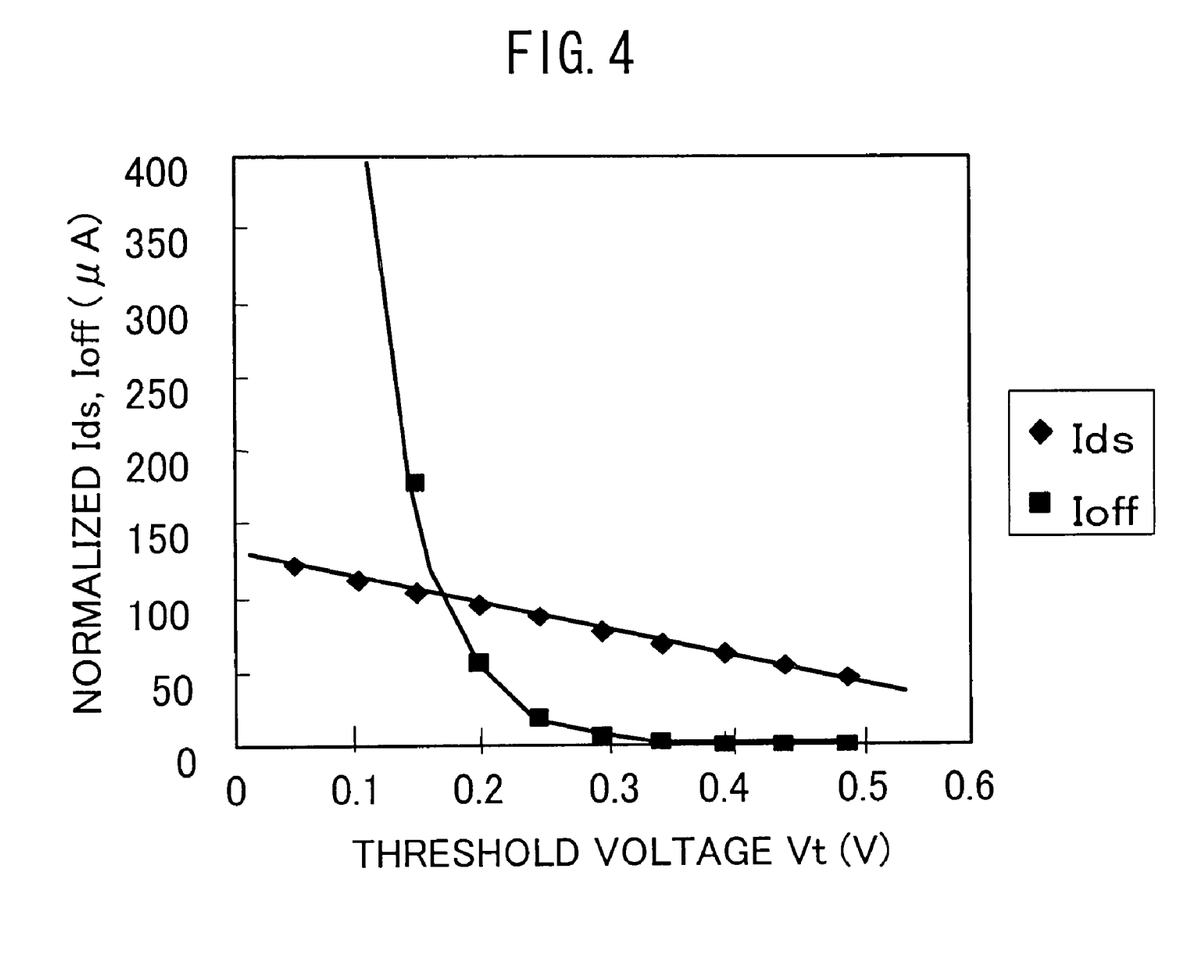
FIG. 4 is a graph illustrating a relationship of threshold voltage to on-current and off-leak current in a MOS transistor.

FIG. 4 is a graph illustrating a relationship of threshold voltage to on-current (Ids) and off-leak current (Ioff) in a common MOS transistor. As shown in FIG. 4, the off-leak current is highly sensitive to variations in threshold voltage of the MOS transistor and shows an exponential increase with a decrease in threshold voltage. If an adjustment is made to the threshold voltage of the MOS transistor by the above-described conventional method, the manufacturing process is complicated, thereby increasing cost. However, the present embodiment is significantly preferable because the threshold voltage is defined by varying the channel width without causing a drastic cost increase.

Figure 5:
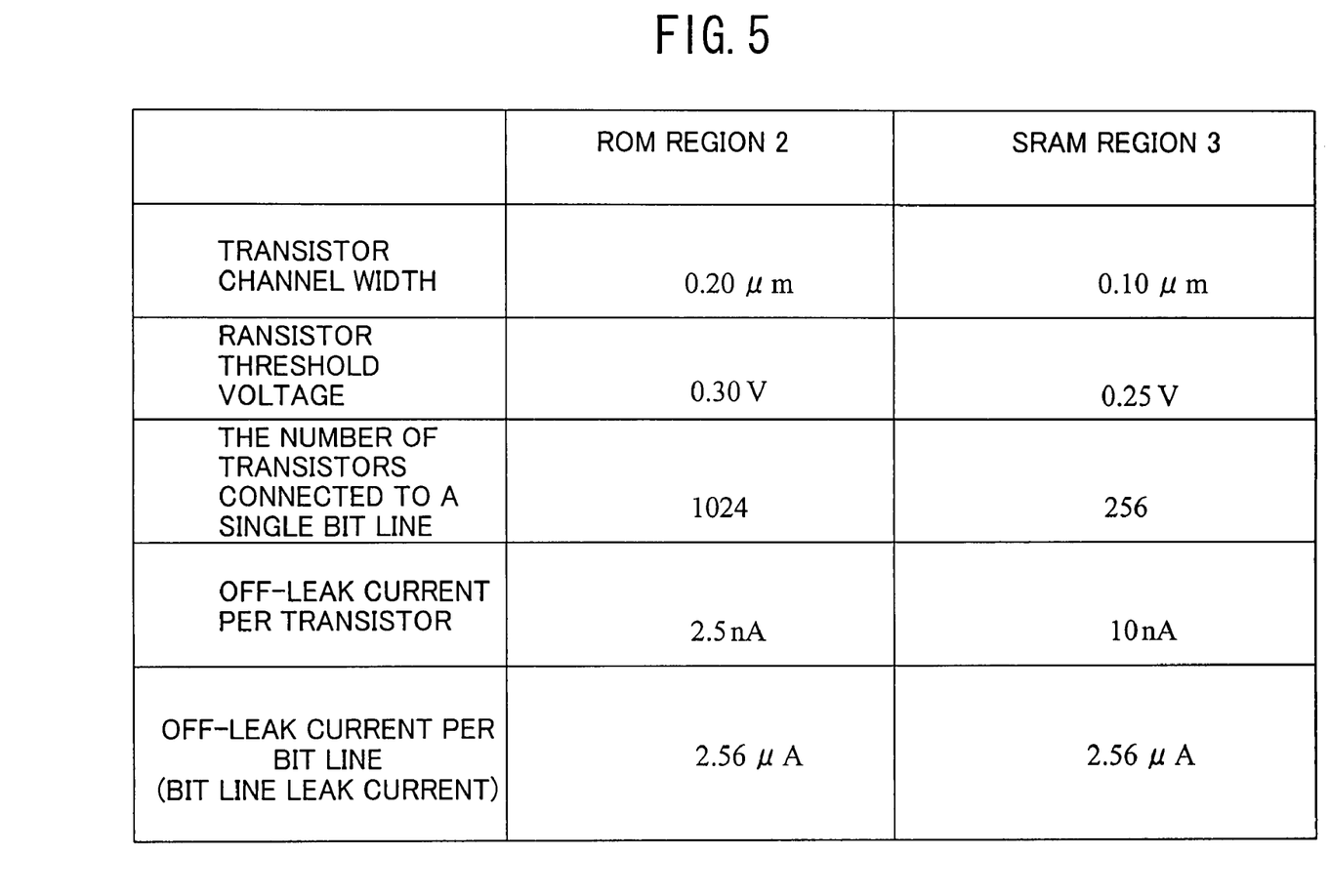
FIG. 5 is a table showing a comparison among channel width, threshold voltage and off-leak current of a transistor, the number of transistors connected to a single bit line and off-leak current per bit line (bit line leak current) in the semiconductor integrated circuit device according to the embodiment of the present invention.

FIG. 5 is a table showing a comparison between the ROM region 2 and the SRAM region 3 on the channel width, threshold voltage and off-leak current of the transistor, the number of transistors connected to a single bit line and the off-leak current per bit line (bit line leak current).

In the present embodiment, as shown in the table of FIG. 5, the channel width of the MOS transistor 1$t$ in the ROM memory cell (0.20 μm) is larger than the channel width of the access transistor 4 in the SRAM memory cell (0.10 μm). Accordingly, depending on the channel widths of the transistors, the threshold voltage of the MOS transistor 1$t$ in the ROM region 1 is set to 0.30 V, while that of the access transistor 4 in the SRAM region 3 is set to 0.25 V. Further, the off-leak current per transistor is 2.5 nA in the MOS transistor 1t, while it is 10 nA in the access transistor 4.

In the present embodiment, the MOS transistors 1$t$ of the ROM memory cells connected to the ROM bit line BLr are larger in number than the access transistors 4 of the SRAM memory cells connected to the SRAM bit line BLs. More specifically, the number of transistors connected to a single bit line (i.e., the number of memory cells connected to a single bit line) is 1024 in the ROM region 1, while it is 256 in the SRAM region 3 as shown in FIG. 5. That is, in the ROM region 1 where the off-leak current per transistor is small (¼ in this embodiment), a larger number of transistors (4 times larger in this embodiment) are connected to a single bit line than in the SRAM region 3. Therefore, the ROM region 1 and the SRAM region 3 show little difference in off-leak current per bit line (hereinafter referred to as bit line leak current) which is the sum of off-leak currents in every memory cell connected to a single bit line (almost equal in this embodiment).

Thus, by optionally changing the number of memory cells connected to a single bit line, the bit line leak currents are determined as required by the ROM region 1 and the SRAM region 3, respectively. In the present embodiment, the bit line leak currents in the ROM region 1 and the SRAM region 3 are almost equal. However, the present invention is not limited thereto. Even if the required bit line leak currents are different between the ROM region 1 and the SRAM region 3, the bit line leak currents are defined as required by optionally changing the number of memory cells connected to a single bit line.

In a conventional manufacturing process, impurity implantation step is carried out more times than in the present embodiment to adjust the threshold voltages that determine the off-leak currents of the SRAM region and the ROM region separately. However, the increase in number of steps inevitably increases the manufacturing cost.

On the other hand, in the present embodiment, instead of performing the impurity implantation step more times, adjustments are made to the number of the MOS transistors connected to a single bit line and the channel widths of the MOS transistors in the ROM region 1 and the SRAM region 3. Thus, a semiconductor integrated circuit device having the SRAMs and the ROMs both including the transistors capable of operating at required threshold voltages is obtained.

In the column switch region 2 on the semiconductor substrate 10, the impurity concentration of the MOS transistors 2$t$ is varied from that of the MOS transistors 1$t$ in the ROM region 1 so as to reduce the absolute value of the threshold voltage of the MOS transistors 2$t$. In the present embodiment, specifically, p-type impurities are not implanted in the column switch region 2 on the semiconductor substrate 10 so that the absolute value of the threshold voltage of the MOS transistors 2$t$ is reduced. Therefore, the threshold voltage of the MOS transistors 2$t$ is kept low even if the channel width thereof increases.

Figure 6:
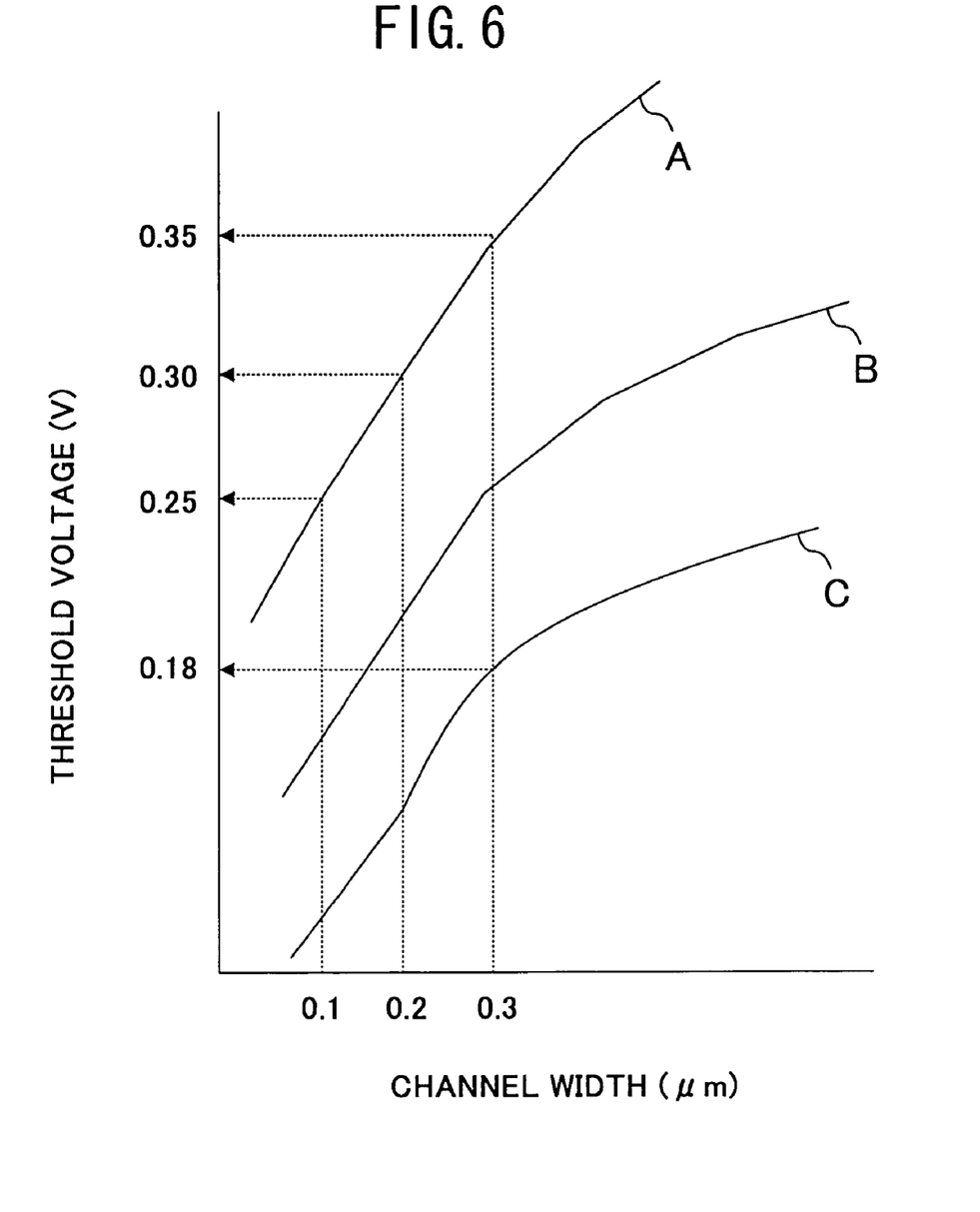
FIG. 6 is a graph illustrating a relationship between channel width and threshold voltage of a transistor in the semiconductor integrated circuit device according to the embodiment of the present invention.

FIG. 6 is a graph illustrating a relationship between the channel width and the threshold voltage of the MOS transistor in each region on the semiconductor substrate 10. In this figure, line A corresponds to the MOS transistor 1$t$ or the access transistor 4 formed in the ROM region 1 or the SRAM region 3, line B corresponds to the MOS transistor formed in the logic circuit region 8 and line C corresponds to the MOS transistor 2$t$ formed in the column switch region 2.

As shown in FIG. 6, the MOS transistor 2$t$ formed in the column switch region 2 shows a lower threshold voltage than the transistors in other regions. In the present embodiment, the channel width of the MOS transistor 2$t$ is set to 0.30 μm. Therefore, the threshold voltage of the MOS transistor 2$t$ becomes 0.18 V, which is lower than the threshold voltage of the MOS transistor 1$t$ in the ROM region 1.

A bit line precharge potential is a voltage obtained by subtracting the threshold voltage of the MOS transistor 2$t$ in the column switch from a power voltage. Therefore, for example, if the power voltage is reduced to 0.7 V for power saving, the precharge potential becomes too low. Conventionally, the threshold voltage of the MOS transistor in the column switch is 0.35 V and the voltage between the source/drain of the MOS transistor of the ROM memory cell is 0.35 V.

In the present embodiment, however, the threshold voltage of the MOS transistor 2$t$ is 0.18 V and the voltage between the source/drain of the MOS transistor 1$t$ of the ROM memory cell is 0.52 V, which is higher than the conventional one. Therefore, a larger on-current is obtained and the ROM is operated with stability at a low voltage.

Manufacturing Method

Figure 7A:
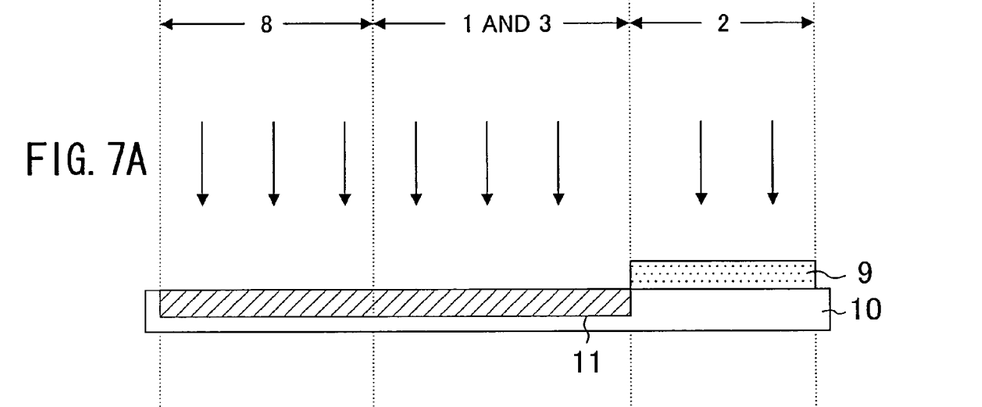
FIGS. 7(a) to 7(c) are sectional views illustrating the steps of manufacturing the semiconductor integrated circuit device according to the embodiment of the present invention.
Figure 7B:
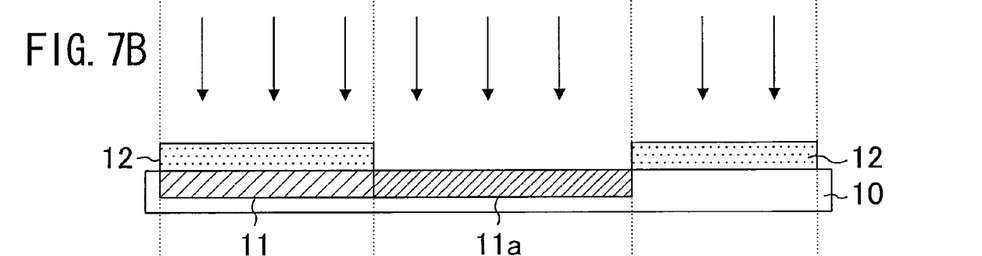
Figure 7C:
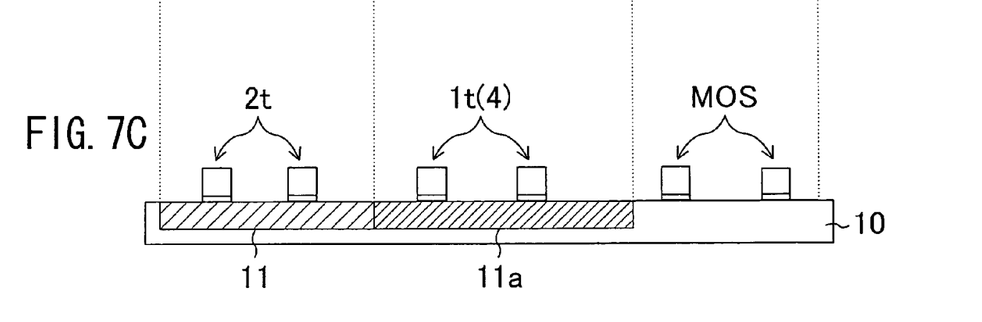

Then, referring to FIGS. 7(a) to 7(c), an explanation is given of a method for manufacturing the semiconductor integrated circuit device 100 of the present embodiment. FIGS. 7(a) to 7(c) are sectional views illustrating the steps of manufacturing the semiconductor integrated circuit device 100 of the present embodiment.

First, in the step shown in FIG. 7(a), the semiconductor substrate 10 is prepared, i.e., the ROM region 1, SRAM region 3, column switch region 2 and logic circuit region 8 are defined on the semiconductor substrate 10. Then, a resist 9 is formed on the column switch region 2 and p-type impurity implantation is carried out using the resist 9 as a mask to form an impurity region 11 at the top of the ROM region 1, SRAM region 3 and logic circuit region 8.

Then, in the step shown in FIG. 7(b), a resist 12 is formed on the column switch region 2 and the logic circuit region 8 and p-type impurity implantation is carried out using the resist 12 as a mask to form a high concentration impurity region 11a at the top of the ROM region 1 and the SRAM region 3.

Then, in the step shown in FIG. 7(c), the MOS transistors 1t, access transistors 4, MOS transistors 2t and other MOS transistors are formed in the ROM region 1, SRAM region 3, column switch region 2 and logic circuit region 8, respectively. At this time, the channel widths of the MOS transistors are adjusted to determine the threshold voltages. Thereafter, depending on the requirements of the ROM region 1 and the SRAM regions 3, the MOS transistors 1t and 2t and the access transistors 4 are connected to the bit lines. If the number of transistors connected to a single bit line is optionally changed, bit line leak currents are determined as required by the ROM region 1 and the SRAM region 3, respectively.

In this way, in the steps shown in FIGS. 7(a) and 7(b), the impurity concentrations in the regions on the semiconductor substrate 10 are varied, thereby adjusting the threshold voltages of the MOS transistors formed in the regions. Then, in the step shown in FIG. 7(c), the bit line leak current is determined. Thus, the semiconductor integrated circuit device 100 having SRAMs and ROMs provided with the associated transistors that meet their required specifications as to the threshold voltages is provided.

Modification

Figure 8:
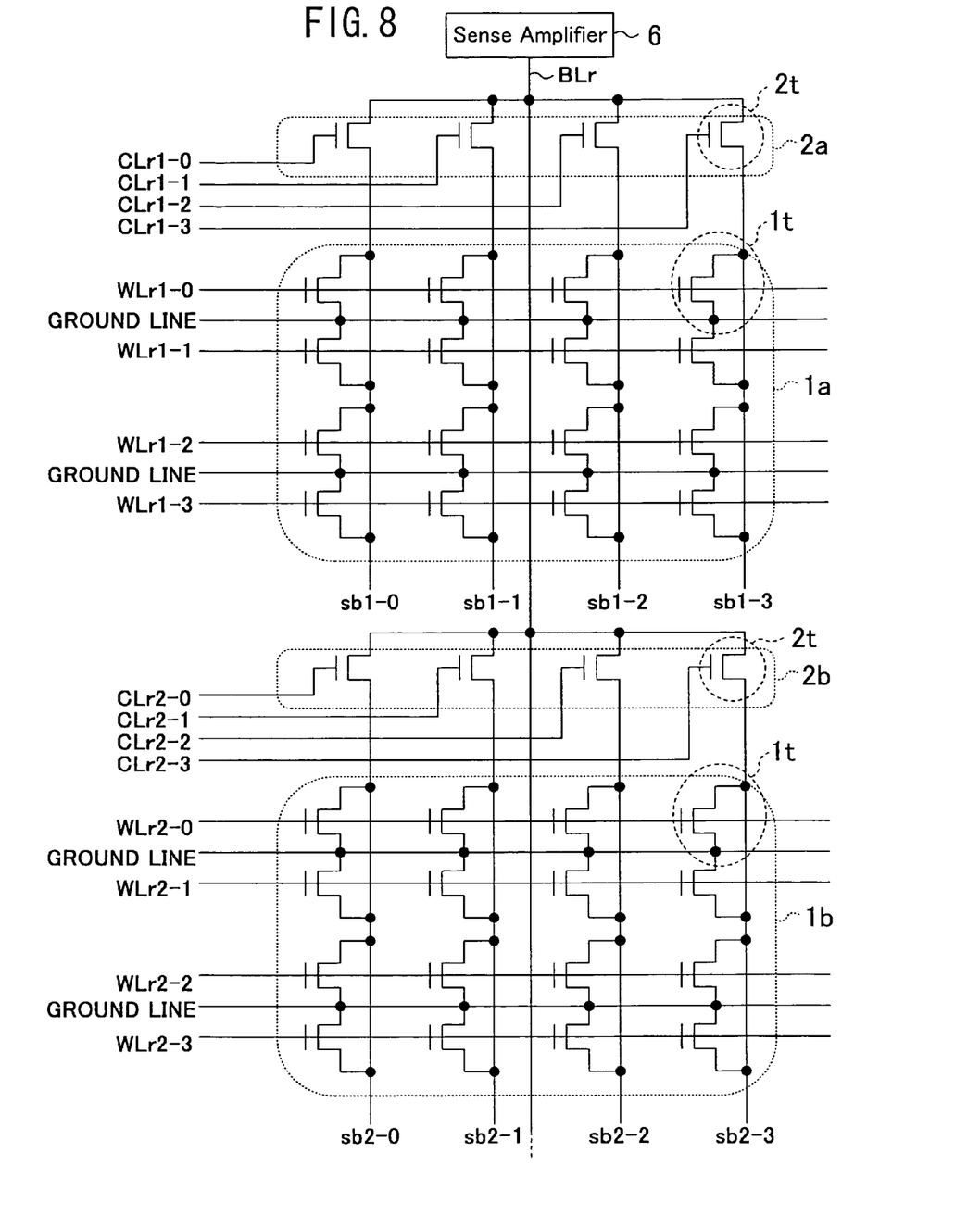
FIG. 8 is a view illustrating another circuit configuration of the semiconductor integrated circuit device according to the embodiment of the present invention.

Referring to FIG. 8, an explanation is given of the semiconductor integrated circuit device 100 of the present embodiment having a different configuration of the ROM region 1 and the column switch region 2.

FIG. 8 is a view illustrating another circuit configuration of the ROM region 1 and the column switch region 2 according to the present embodiment.

The ROM region 1 includes a plurality of sub ROM regions and the column switch region 2 includes sub column switch regions connected to the bit lines BLr as shown in FIG. 8. As an example, FIG. 8 shows two sub ROM regions 1a and 1b and two column switch regions 2a and 2b. The sub ROM region 1a and the column switch region 2a are connected via sub bit lines sb (sb1-0 to sb1-3 in FIG. 8) and the sub ROM region 1b and the column switch region 2b are connected via sub bit lines sb (sb2-0 to sb2-3 in FIG. 8).

In the sub ROM regions 1a and 1b, as shown in FIG. 8, n-channel type MOS transistors 1t are arranged in matrix. Sources/drains of the MOS transistors 1t are connected to the sub bit lines sb and ground lines, while gates are connected to word lines WLr (WLr0 to WLr3 in FIG. 8). That is, in the same manner as Embodiment 1, a ROM memory cell is constituted of a single MOS transistor 1t and a ground line, a sub bit line sb and a word line WLr which are connected to the MOS transistor 1t.

In the column switch regions 2a and 2b, as shown in FIG. 8, n-channel type MOS transistors 2t are arranged in a one-to-one relationship with the bit lines. Sources/drains of the MOS transistors 2t are connected to the sub bit lines sb and a sense amplifier 6, while gates are connected to column select lines CLr (CLr1-0 to CLr1-3 and CLr2-0 to CLr2-3 in FIG. 8), respectively.

Also in this embodiment, the MOS transistors it in the ROM region 1 and the channel regions of the access transistors 4 in the SRAM region 3 have substantially the same p-type impurity concentration. Therefore, in this embodiment, an adjustment is made to the threshold voltages of the transistors by making use of the great dependence of the threshold voltage of the transistor on the channel width.

According to the configuration of the present embodiment, the off-leak current per bit line BLr (bit line leak current) is limited to the off-leak current of the memory cells connected to a selected sub bit line. Therefore, the bit line leak current is suppressed.

In the same manner as Embodiment 1, in the column switch regions 2a and 2b of the present embodiment, the impurity concentration of the MOS transistors 2t is varied from that of the MOS transistors 1t in the ROM region 1 so as to reduce the absolute value of the threshold voltage of the MOS transistors 2t. Specifically, in the same manner as Embodiment 1, p-type impurities are not implanted in the column switch regions 2a and 2b so that the absolute value of the threshold voltage of the MOS transistors 2t is reduced. Therefore, the threshold voltage of the MOS transistors 2t is kept low even if the channel width thereof increases.

According to the configuration of the present embodiment, a large capacitance is given to the bit line BLr between column switches of the column switch regions 2a and 2b and the sense amplifier 6. Therefore, the above-described reduction in threshold voltages of the MOS transistors 2t forming the column switches leads to effective reduction in access time.

Figure 9:
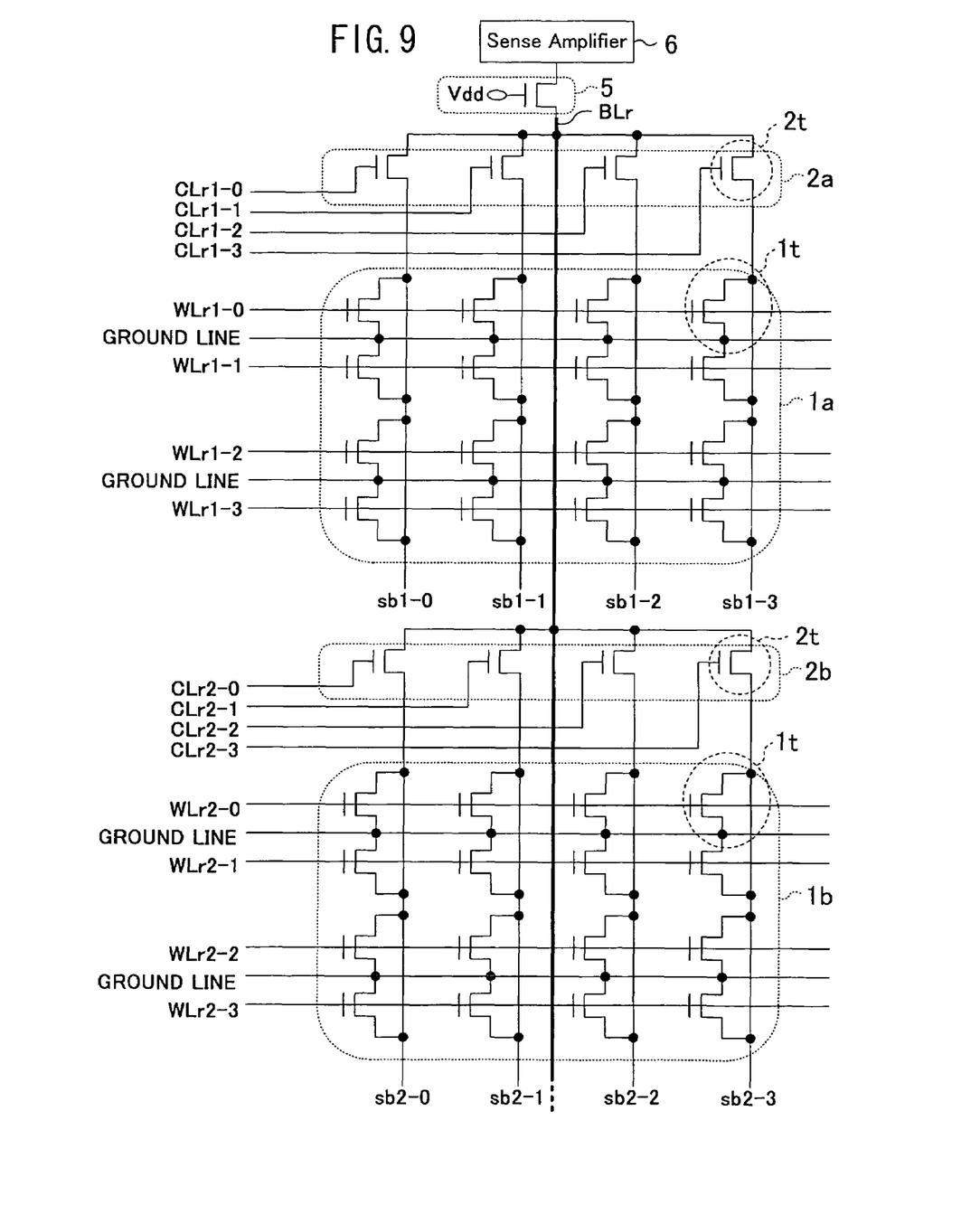
FIG. 9 is a view illustrating still another circuit configuration of the semiconductor integrated circuit device according to the embodiment of the present invention.

FIG. 9 is a view illustrating still another circuit configuration of the ROM region 1 and the column switch region 2 according to the present embodiment.

The circuit configuration in the ROM region 1 and the column switch region 2 shown in FIG. 9 is almost the same as that shown in FIG. 8 except that an n-channel type MOS transistor 5 having a gate connected to a power line Vdd is arranged between the column switch regions 2a and 2b and the sense amplifier 6.

With this configuration, the capacitance of the bit line BLr between the column switches of the column switch regions 2a and 2b and the sense amplifier 6 becomes ignorable.

It is preferable that the MOS transistor 5 is also formed in the column switch regions 2a and 2b and has a threshold voltage which is reduced to the same extent as that of the MOS transistor 2t. By so doing, the capacitance of the bit line BLr between the column switches and the sense amplifier 6 is isolated and at the same time, the voltage between the source/drain of the MOS transistor 2 is prevented from decreasing. Thus, the ROMs are operated with stability at high speed and a low voltage.

In the above embodiments of the present invention, an explanation is given of a semiconductor integrated circuit device formed on a semiconductor substrate 10 in which p-type impurities are implanted to form n-channel type MOS transistors. However, the present invention is not limited thereto. For example, n-type impurities may be implanted into the semiconductor substrate 10 to form p-channel MOS transistors. Although the MOS transistors are used in the above embodiment, the present invention is not limited thereto. The present invention is applicable as long as MIS transistors are used.

As described above, the present invention is useful for the manufacture of semiconductor integrated circuit devices, e.g., SRAMs, ROMs, flash memories and DRAMs whose operations are affected by off-leak current of transistors connected to bit lines.

What is claimed is:

1. A semiconductor integrated circuit device comprising:
a semiconductor substrate including an SRAM region and a ROM region;
a plurality of SRAM memory cells, each of which is formed in the SRAM region and includes a flip-flop, a pair of access transistors of a first conductive type connected to the flip-flop and a pair of SRAM bit lines connected to the pair of access transistors, respectively; and
a plurality of ROM memory cells, each of which is formed in the ROM region and includes a ROM transistor of the first conductive type and a ROM bit line connected to the ROM transistor,
wherein a number of the SRAM memory cells connected to each pair of SRAM bit lines is smaller than a number of the ROM memory cells connected to the ROM bit line,
the ROM transistor has a larger channel width than the access transistors, and
the ROM transistor is implanted with impurities having substantially the same concentration as impurities implanted in the pair of access transistors of the SRAM memory cells, and
wherein the semiconductor substrate further includes a ROM column switch region having a ROM column switch comprising a switching transistor of the first conductive type connected to the ROM bit line, and the switching transistor is implanted with second conductivity type impurities at a concentration different from the concentration of the ROM transistor so that the absolute value of the threshold voltage thereof is reduced.

2. The semiconductor integrated circuit device according to claim 1, wherein the semiconductor substrate further comprises a logic circuit region including transistors implanted with impurities having a lower concentration level than the impurities implanted in the pair of access transistors.

3. The semiconductor integrated circuit device according to claim 2, wherein the ROM bit line includes a main line and a sub line connected to the main line and the switching transistor in the ROM column switch is connected to the main line.

4. The semiconductor integrated circuit device according to claim 1, wherein the number of the SRAM memory cells connected to each pair of SRAM bit lines and the number of the ROM memory cells connected to the ROM bit line are set based on a difference of off-leak currents between one of the pair of access transistors and the ROM transistor.

5. The semiconductor integrated circuit device according to claim 4, further comprising a connection transistor of the first conductivity type connected to the switching transistor and a sense amplifier connected to the connection transistor, wherein the connection transistor is implanted with the second conductivity type impurities at the same concentration as the switching transistor.

* * * * *